United States Patent [19]

Kataoka

[11] Patent Number: 4,518,675

[45] Date of Patent: May 21, 1985

[54] STRIPPER FOR RADIOSENSITIVE RESIST

[75] Inventor: Mutsuo Kataoka, Kamakura, Japan

[73] Assignee: Toray Industries, Incorporated, Japan

[21] Appl. No.: 466,330

[22] Filed: Feb. 14, 1983

[30] Foreign Application Priority Data

Feb. 15, 1982 [JP] Japan ................................. 57-21288

[51] Int. Cl.³ .................... G03C 11/12; C11D 1/18; B08B 7/00
[52] U.S. Cl. .................................. 430/256; 430/260; 430/281; 430/329; 134/38; 252/153; 252/158; 252/549; 252/DIG. 4; 252/DIG. 8
[58] Field of Search .............. 430/256, 260, 329, 281, 430/325, 326, 331; 252/DIG. 8, 153, 158, 549, 252/DIG. 4; 134/38

[56] References Cited

U.S. PATENT DOCUMENTS

| | | | |
|---|---|---|---|
| 2,694,658 | 11/1954 | Crepeau et al. | 134/26 |
| 2,850,411 | 9/1958 | Bratring | 134/29 |
| 3,679,593 | 7/1972 | Hansen et al. | 252/170 |
| 3,784,477 | 1/1974 | Esposito | 252/162 |
| 3,980,587 | 9/1976 | Sullivan | 252/546 |
| 4,078,102 | 3/1978 | Bendz et al. | 427/341 |
| 4,202,703 | 5/1980 | Zuber et al. | 134/2 |
| 4,259,407 | 3/1981 | Tada et al. | 428/421 |
| 4,304,681 | 12/1981 | Martin et al. | 252/143 |
| 4,426,250 | 1/1984 | Brailsford | 156/655 |

OTHER PUBLICATIONS

Tada, J. Electrochem. Soc.: Accelerated Brief Communication, Nov. 1979, pp. 1829–1830.
Fieser et al., *Organic Experiments*, 3rd Ed., D. C. Heath and Co., Lexington, Mass., 1975, pp. 168, 339, 345.

*Primary Examiner*—John E. Kittle
*Assistant Examiner*—José G. Dees
*Attorney, Agent, or Firm*—Scully, Scott, Murphy & Presser

[57] ABSTRACT

As a stripper for a radiosensitive resist formed of a poly(fluoroalkyl α-haloacrylate) or a copolymer thereof, there is used a solution which contains 0.1 to 40 wt. % of an alkali metal alkoxide, an alkali metal hydroxide or a tetraalkylammonium hydroxide in a substantially non-aqueous polar solvent of dimethyl sulfoxide.

21 Claims, No Drawings

STRIPPER FOR RADIOSENSITIVE RESIST

BACKGROUND OF THE INVENTION

The present invention relates to a stripper for an organic polymer type radiosensitive resist used in the production of IC, LSI, or the like and more particularly to a stripper for fluoroalkyl α-haloacrylate polymers used as a deep ultraviolet and electron beam resist.

Heretofore, as the process for stripping from a substrate polymers used as radiosensitive resists such as poly(methyl methacrylate) and poly(methyl isopropenyl ketone), there have been known a wet process which employs concentrated sulfuric acid, concentrated sulfuric acid-hydrogen peroxide, or organic solvent, and a dry process which employs oxygen plasma. However, according to the process which employs a stripper consisting mainly of concentrated sulfuric acid, poly(fluoroalkyl α-haloacrylate) and copolymers thereof are poor in solubility and not stripped to a satisfactory extent. And according to the process which employs an organic solvent, the polymers may remain on the substrate in small amounts and it is difficult to obtain a mask or chip in high yield. In both processes, moreover, a resist which has been treated with plasma is more difficult to be stripped.

The process using oxygen plasma is an effective process, but is unsuitable for stripping a resist portion remaining thick on the edges and the back of the substrate.

SUMMARY OF THE INVENTION

It is an object of the present invention to overcome the above-mentioned disadvantages of the prior arts.

It is another object of the present invention to provide a stripper and a stripping process both permitting an easily and sure stripping from a substrate of a radiosensitive resist formed of a poly(fluoroalkyl α-haloacrylate) or a copolymer thereof.

The above-mentioned objects of the present invention can be attained by using as a stripper a solution containing in a polar solvent 0.1 to 40 wt. % of at least one compound selected from the group consisting of alkali metal alkoxides, alkali metal hydroxides and tetraalkylammonium hydroxides in a resist process which employs a fluoroalkyl α-haloacrylate polymer as a radiosensitive resist.

The resists to which is applied the stripper of the present invention comprise fluoroalkyl α-haloacrylate polymers. The fluoroalkyl α-haloacrylate polymers as referred to herein include poly(fluoroalkyl α-haloacrylate) and copolymers thereof.

More specifically, homopolymers of acrylate monomers represented by the general formula

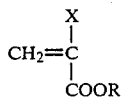   (I)

wherein X is fluorine, chlorine or bromine and R is an alkyl group in which one or more hydrogen atoms are substituted by fluorine atoms, and copolymers of two or more of those monomers, as well as copolymers of at least one of those monomers with other vinyl monomers, are preferred. As R in the above general formula (I), lower alkyl groups in which more than one-third of hydrogen atoms are substituted by fluorine atoms are particularly preferred. The "lower" as referred to herein means that the number of carbon atoms is not larger than eight.

Resists formed of these polymers, which are disclosed, for example, in Japanese Patent Laying Open Print No. 18638/1980, are now used in the semiconductor industry as positive type electron beam resists of high sensitivity and high resolution.

It is essential for the stripper of the present invention to contain an alkali metal alkoxide, an alkali metal hydroxide and/or a tetraalkylammonium hydroxide.

Preferred examples of alkali metal alkoxides which may be used in the present invention are alkali metal lower alkoxides such as methoxysodium, ethoxysodium, n-propoxysodium, isopropoxysodium, t-butoxysodium, methoxypotassium, ethoxypotassium, n-propoxypotassium, isopropoxypotassium and t-butoxypotassium. Preferred examples of alkali metal hydroxides which may be used in the present invention include lithium hydroxide, sodium hydroxide and potassium hydroxide. Furthermore, preferred examples of tetraalkylammonium hydroxides which may be used in the present invention are tetraloweralkylammonium hydroxides such as tetramethylammonium hydroxide and tetraethylammonium hydroxide.

Such basic compound or compounds are dissolved in a polar solvent at a concentration of 0.1 to 40 wt. % to prepare the stripper of the invention. If the concentration thereof is lower than 0.1 wt. %, it is impossible to attain a satisfactory stripping effect, and concentrations thereof higher than 40 wt. % are disadvantageous from the operational standpoint.

The polar solvent used in the present invention is not specially limited. There may be used any polar solvents if only they dissolve the aforementioned basic compounds and do not react therewith. But, water-soluble polar organic solvents are preferred in view of a subsequent water-washing step. Suitable examples include alcohols such as methanol, ethanol, n-propanol, isopropanol and t-butanol, non-protonic polar organic solvents such as dimethyl sulfoxide, dimethylformamide and hexamethyl phosphoryl amide, and mixtures thereof. A small amount of water may be incorporated in such polar organic solvents. In this case, the amount of water is preferably not more than 10 wt. % based on the amount of the solvent.

As the process of using the stripper of the present invention, there may be adopted the dipping or spray process usually employed for the stripping of resists. A treating time ranging from 0.5 to 30 minutes is usually preferable although the treating time differs according to the kind of reagent used, and a treating temperature ranging from 15° to 70° C. is usually preferable although the treating temperature may be selected in the range between room temperature and the boiling point of the solvent used.

Before treatment with the stripper of the present invention, the substrate may be treated with an organic solvent which dissolves the resist formed thereon. Such a pretreatment is advantageous because it leads to shortening of the time required for the stripping process and to a more perfect stripping.

The fluoroalkyl α-haloacrylate polymer treated with the stripper of the present invention undergoes reactions such as elimination of hydrogen chloride, hydrolysis and cleavage of the main chain and becomes lower in its molecular weight and at the same time becomes soluble in water. That is, by a mere subsequent washing of the so-treated substrate with pure water, it is possible to remove the residual polymer completely.

The following examples are given to further illustrate the present invention, but it is to be understood that the invention is not limited thereto.

EXAMPLE 1

A 10% solution of poly(2,2,2-trifluoroethyl α-chloroacrylate) in methyl cellosolve acetate was spin coated onto a chromium substrate to form a 0.5 μm thick resist film on the substrate, which was then prebaked at 200° C. for 30 minutes. Then, a 0.1 μm dia. electron beam at an acceleration voltage of 20 kV was directed to a desired area of the prebaked resist film at a dose of 1.2 μC/cm$^2$ to describe a pattern thereon, followed by development with a developer comprising a mixed solution (weight ratio: 7:3) of methyl isobutyl ketone and isopropyl alcohol, thereby allowing the electron beam applied area to be dissolved off selectively to form a resist pattern on the chromium substrate.

The substrate was then postbaked at 100° C. for 30 minutes and thereafter etched with a conventional etching solution consisting mainly of ceric ammonium nitrate and perchloric acid.

Subsequently, the substrate was dipped in a solution of 8% sodium hydroxide in methanol and heated at 50° C. for 10 minutes. As a result, the resist film was discolored into brown. Upon subsequent washing of the substrate with pure water, the resist layer was removed completely.

EXAMPLE 2

A chromium substrate after etching which had been treated in the same way as in Example 1 was dipped in ethyl acetate for 5 minutes at room temperature and then dipped in a solution of 10% potassium hydroxide in ethanol for 5 minutes at 50° C. Upon subsequently washing of the substrate with pure water, the resist layer was removed completely.

EXAMPLE 3

A 10% solution of poly(1-trifluoromethylethyl α-chloroacrylate) in methyl cellosolve acetate was spin coated onto a chromium substrate to form a 0.5 μm thick resist film thereon, which was then prebaked at 200° C. for 30 minutes.

The substrate was dipped in a 10% solution of tetramethylammonium hydroxide in methanol at 50° C. for 10 minutes and then washed with pure water. The resist layer was completely removed with no remaining thin film. This was confirmed by a microscopic observation and also by the fact that upon immersion of the chromium substrate in an etching solution the chromium layer was immediately dissolved therein.

EXAMPLE 4

An 8% solution of poly(2,2,3,3,3-pentafluoropropyl α-chloroacrylate) in methyl cellosolve acetate was spin coated onto a chromium substrate to form a 0.5 μm thick resist film thereon, which was then prebaked at 170° C. for 30 minutes.

The substrate was dipped in dimethyl sulfoxide for 2 minutes at room temperature and then dipped in a mixture (volume ratio: 8:2) of dimethyl sulfoxide and a 10% solution of potassium hydroxide in methanol for 2 minutes at room temperature. On subsequent washing with pure water, the resist layer was removed completely.

EXAMPLE 5

A 7% solution of poly(2,2,3,3,4,4,4-heptafluorobutyl α-chloroacrylate) in methyl cellosolve acetate was spin coated onto a silicon wafer to form a 0.5 μm thick resist film thereon, which was then prebaked at 180° C. for 30 minutes.

The substrate was dipped in a mixture (volume ratio: 8:2) of dimethyl sulfoxide and a 5% solution of sodium hydroxide in ethanol for 5 minutes at room temperature. On subsequent washing with pure water, the resist layer was completely removed.

EXAMPLE 6

A 7% solution of poly(2,2,2-trifluoro-1,1-dimethylethyl α-chloroacrylate) in methyl cellosolve acetate was spin coated onto a chromium substrate to form a 0.5 μm thick resist film, which was then prebaked at 150° C. for 30 minutes.

The substrate was dipped in a 5% solution of ethoxysodium in ethanol at 50° C. for 10 minutes and then washed with pure water. As a result, the resist layer was completely removed.

EXAMPLE 7

An 8% solution of poly(2,2,2-trifluoroethyl α-bromoacrylate) in methyl cellosolve acetate was spin coated onto a chromium substrate to form a 0.5 μm thick resist film, which was then prebaked at 150° C. for 30 minutes.

The substrate was dipped in a 10% solution of methoxysodium in methanol at 50° C. for 10 minutes and then washed with pure water. As a result, the resist layer was completely removed.

What is claimed is:

1. A stripper for a radiosensitive resist formed of a fluoroalkyl alpha-haloacrylate polymer, said stripper consisting essentially of a substantially non-aqueous polar solvent of dimethyl sulfoxide, and 0.1 to 40 weight percent of at least one compound selected from the group consisting of alkali metal alkoxides and tetraalkylammonium hydroxides, said stripper further characterized as being used with a post-stripping water rinse and useful at room temperature.

2. The stripper of claim 1, wherein said compound is an alkali metal alkoxide.

3. The stripper of claim 2, wherein said alkali metal alkoxide is a sodium lower alkoxide or a potassium lower alkoxide.

4. The stripper of claim 1, wherein said compound is a tetraalkylammonium hydroxide.

5. The stripper of claim 4, wherein said tetraalkylammonium hydroxide is a tetraloweralkylammonium hydroxide.

6. A stripper for a radiosensitive resist formed of a fluoroalkyl alpha-haloacrylate polymer, said stripper consisting essentially of a substantially non-aqueous polar solvent mixture of dimethyl sulfoxide and a lower alcohol, and 0.1 to 40 weight percent of at least one compound selected from the group consisting of alkali metal alkoxides, alkali metal hydroxides and tetraalkylammonium hydroxides, said stripper further characterized as being used with a post-stripping water rinse and useful at room temperature.

7. The stripper of claim 6 wherein said alkali metal alkoxide is a sodium lower alkoxide or a potassium lower alkoxide.

8. The stripper of claim 6 wherein said tetraalkylammonium hydroxide is tetraloweralkylammonium hydroxide.

9. The stripper of claim 6, wherein said compound is an alkali metal hydroxide.

10. The stripper of claim 9, wherein said alkali metal hydroxide is lithium hydroxide, sodium hydroxide, or potassium hydroxide.

11. A process of stripping a radiosensitive resist formed of a fluoroalkyl α-haloacrylate polymer, which process comprises contacting a substrate having said radiosensitive resist formed thereon with a solution at room temperature, said solution containing 0.1 to 40 weight percent of at least one compound selected from the group consisting of alkali metal alkoxides and tetraalkylammonium hydroxides in a substantially non-aqueous polar solvent of dimethyl sulfoxide, and subsequently washing said stripped substrate with water.

12. The process of claim 11, wherein said substrate is pretreated with an organic solvent capable of dissolving said resist.

13. The process of claim 11 wherein said alkali metal alkoxide is a sodium lower alkoxide or a potassium lower alkoxide.

14. The process of claim 11 wherein said tetraalkylammonium hydroxide is a tetraloweralkylammonium hydroxide.

15. The process of claim 11 wherein said substantially non-aqueous polar solvent of dimethyl sulfoxide contains not more than 10 weight percent of water.

16. A process for stripping a radiosensitive resist formed of a fluoroalkyl alpha-haloacrylate polymer which process comprises contacting a susbstrate having said radiosensitive resist formed thereon with a solution at room temperature, said solution containing 0.1 to 40 percent of at least one compound selected from the group consisting of alkali metal alkoxides, alkali metal hydroxides and tetraalkylammonium hydroxides in a substantially non-aqueous polar solvent mixture of dimethylsulfoxide and a lower alcohol, and subsequently washing said stripped substrate with water.

17. The process of claim 16 wherein said substrate is pretreated with an organic solvent capable of dissolving said resist.

18. The process of claim 16 wherein said alkali metal alkoxide is a sodium lower alkoxide or a potassium lower alkoxide.

19. The process of claim 16 wherein said alkali metal hydroxide is lithium hydroxide, sodium hydroxide or potassium hydroxide.

20. The process of claim 16 wherein said tetraalkylammonium hydroxide is a tetraloweralkylammonium hydroxide.

21. The process of claim 16 wherein said substantially non-aqueous polar solvent mixture of dimethyl sulfoxide and a lower alcohol contains not more than 10 weight percent of water.

* * * * *

UNITED STATES PATENT AND TRADEMARK OFFICE
CERTIFICATE OF CORRECTION

PATENT NO. : 4,518,675
DATED : May 21, 1985
INVENTOR(S) : Mutsuo Kataoka

It is certified that error appears in the above—identified patent and that said Letters Patent are hereby corrected as shown below:

Col. 6, Line 8, after "40" insert --weight--.

Signed and Sealed this

Third Day of September 1985

[SEAL]

Attest:

DONALD J. QUIGG

Attesting Officer     Acting Commissioner of Patents and Trademarks - Designate